(12) United States Patent
DeLessert

(10) Patent No.: US 7,371,128 B2
(45) Date of Patent: May 13, 2008

(54) CABLE TERMINAL WITH AIR-ENHANCED CONTACT PINS

(75) Inventor: Dan DeLessert, Newberg, OR (US)

(73) Assignee: Precision Interconnect, Inc., Wilsonville, OR (US)

( * ) Notice: Subject to any disclaimer, the term of this patent is extended or adjusted under 35 U.S.C. 154(b) by 0 days.

(21) Appl. No.: 10/794,643

(22) Filed: Mar. 5, 2004

(65) Prior Publication Data

US 2005/0079772 A1   Apr. 14, 2005

Related U.S. Application Data

(63) Continuation-in-part of application No. 10/686,147, filed on Oct. 14, 2003.

(51) Int. Cl.
*H01R 13/24* (2006.01)

(52) U.S. Cl. ..................................... 439/700

(58) Field of Classification Search ............... 439/700, 439/219, 169, 428
See application file for complete search history.

(56) References Cited

U.S. PATENT DOCUMENTS

| | | | | |
|---|---|---|---|---|
| 3,548,829 A * | 12/1970 | Reynolds et al. | ............ | 606/26 |
| 4,041,380 A | 8/1977 | Epstein et al. | | |
| 4,209,742 A * | 6/1980 | Bender et al. | ............ | 324/72.5 |
| 4,418,314 A * | 11/1983 | Nieto, Jr. | ............ | 324/72.5 |
| 4,568,873 A * | 2/1986 | Oyanagi et al. | ............ | 324/662 |
| 4,739,259 A | 4/1988 | Hadwin et al. | | |
| 4,904,935 A * | 2/1990 | Calma et al. | ............ | 324/754 |
| 5,046,968 A * | 9/1991 | Baur et al. | ............ | 439/620 |
| 5,084,673 A * | 1/1992 | Kazama | ............ | 324/761 |
| 5,103,165 A * | 4/1992 | Sirattz | ............ | 324/133 |
| 5,196,789 A * | 3/1993 | Golden et al. | ............ | 439/482 |
| 5,248,266 A * | 9/1993 | Clyatt et al. | ............ | 439/620 |
| 5,942,701 A * | 8/1999 | Kamiya | ............ | 439/482 |
| 6,407,562 B1 * | 6/2002 | Whiteman | ............ | 324/754 |
| 6,552,523 B2 * | 4/2003 | Huard | ............ | 324/72.5 |
| 6,575,772 B1 | 6/2003 | Soubh et al. | | |
| 6,688,906 B2 * | 2/2004 | Kimbley | ............ | 439/482 |
| 7,118,382 B2 * | 10/2006 | Kerekes et al. | ............ | 439/63 |

FOREIGN PATENT DOCUMENTS

| | | |
|---|---|---|
| DE | 3500226 A1 | 7/1986 |
| DE | 7914951 U1 | 7/1989 |
| DE | 3815573 A1 | 11/1989 |
| EP | 0257832 A | 3/1988 |
| GB | 2125236 A | 2/1984 |

OTHER PUBLICATIONS

International Search Report for International Application No. PCT/US2005/007042.
International Search Report for International Application No. PCT/US2004/033373.

* cited by examiner

*Primary Examiner*—Briggitte R. Hammond

(57) ABSTRACT

An electrical connector has a body with a number of probes. Each probe has a spring biased pin with a contact tip, and includes a sleeve receiving the pin. Each sleeve has a first end connected to an incoming conductor, a second end connected to the body and from which the pin protrudes, and an intermediate portion suspended out of contact with the body. The sleeve may be spaced apart from adjacent sleeves, and suspended in air except at their ends. The probes may each be connected to coaxial cables, with alternating probes connected in alternating fashion to coaxial cable shields and signal conductors.

19 Claims, 6 Drawing Sheets

CABLE TERMINAL WITH AIR-ENHANCED CONTACT PINS

REFERENCE TO RELATED APPLICATION

This is a Continuation-in-Part of application Ser. No. 10/686,147, filed Oct. 14, 2003, entitled Cable Terminal with Contact Pins Including Electrical Component.

FIELD OF THE INVENTION

This invention relates to electrical probes, and more particularly to probes for high speed cables terminals with multiple conductors.

BACKGROUND OF THE INVENTION

Certain high speed electronic cable terminals employ arrays of spring pins to contact pads or lands of a circuit board or integrated circuit under test, or to contact connections of an electronic device for a permanent connection. The spring pins are straight, elongated pins received in cylindrical sleeves, and which are axially biased by spring pressure to an extended position. All pins extend in the same direction, with all the pin tips in a common plane. Contact is made by aligning the terminal with the device being probed or contacted, and applying axial pressure to ensure contact by each pin with a minimum pressure. The range of motion of each pin accommodates contour variations in the device being contacted, and slight variations in the position of each pin.

For applications in which very high frequency signals are to be transmitted, the cable to which the terminal is connected may be formed of coaxial wires, each shielded to provide consistent performance and to prevent cross talk and other electronic interference. A terminal housing having a metal shield layer encloses the sleeves retaining the pins. One such particularly effective device is shown in U.S. Pat. No. 6,575,772 to Soubh, the disclosure of which is incorporated herein by reference. This prior art connector has proven effective at providing a high impedance/high frequency probe assembly with relatively small probe spacing. It is believed to be useful for frequencies as high as 5 GHz. However, while effective, this limitation prevents usage for higher frequency applications.

Other prior art embodiments have sought to provide a high-speed connector with a metal block having sleeved spring pins inserted and protruding beyond the periphery of the block. While adequate for some applications, these suffer from certain performance variations between different connectors. Signals are carried through sleeves that are insulated from the block, and ground signals are carried through sleeves that are connected to the block. The ohmic connection between a ground pin sleeve and the block normally occurs near the periphery of the block, because the sleeve has a slightly wider portion at its end adjacent to the aperture from which the spring pin emerges. Thus, a ground signal is conducted from the pin tip, down the length of the pin to the spring at the opposite end of the pin, which bears on the sleeve. The ground signal then passes along the sleeve in the reverse direction until it reaches the point of contact where the sleeve bulges and is press-fit within the block, after which the ground signal is conducted through the block in the original direction. However, if the pin makes contact with the sleeve near the sleeve aperture, or if the sleeve makes contact with the block well away from the aperture, the ground signal path is substantially shortened, avoiding the zigzagging path described above in the nominal case. This possibility can lead to inconsistent performance between ground conductors, impairing results.

SUMMARY OF THE INVENTION

The present invention overcomes the limitations of the prior art by providing an electrical connector having a body with a number of probes. Each probe has a spring biased pin with a contact tip, and includes a sleeve receiving the pin. Each sleeve has a first end connected to an incoming conductor, a second end connected to the body and from which the pin protrudes, and an intermediate portion suspended out of contact with the body. The sleeve may be spaced apart from adjacent sleeves, and suspended in air except at their ends. The probes may each be connected to coaxial cables, with alternating probes connected in alternating fashion to coaxial cable shields and signal conductors.

DETAILED DESCRIPTION OF A PREFERRED EMBODIMENT

Figure 1:
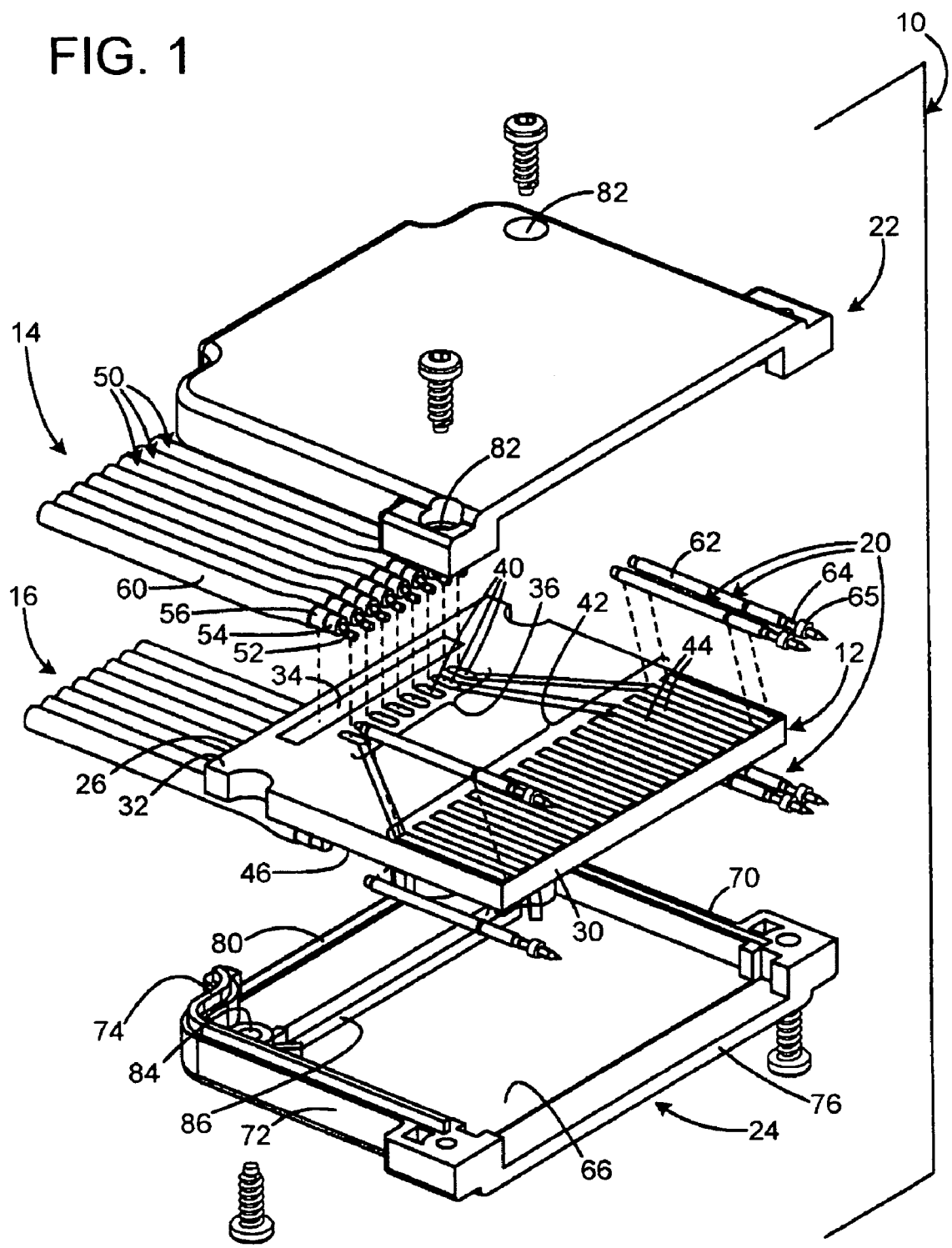
FIG. 1 is an exploded perspective view of a cable terminal assembly according to a preferred embodiment of the invention.

FIG. 1 shows an exploded view of a cable terminal 10. The terminal includes a printed circuit board 12 to which are connected a first ribbon cable 14, and a second ribbon cable 16. A plurality of spring pins 20 are also connected to the board. A housing having an upper shell half 22 and a lower shell half 24 enclose the board.

The printed circuit board is a generally rectangular shape having a cable attachment edge 26 and an opposed pin attachment edge 30. The board includes a pattern of exposed pads and covered traces, all formed of conductive material such as copper foil. Referring to an upper major face 32 of the board, the pattern includes an elongated ground bar 34 parallel to and adjacent to the cable attachment edge 26. Adjacent to and parallel to the ground bar is an array 36 of separate signal pads 40, each pad being perpendicular to edge 26.

An array 42 of elongated pin attachment pads 44 is positioned along the entire length of the pin attachment edge 30 of the board. Each pad is an exposed elongated element having an axis perpendicular to the board edge 30. The array 42 has an odd number of pads, with the end most pads being considered as odd numbered. All odd numbered pads are connected by way of traces on the board surface, and/or buried ground planes to be discussed below, to the ground bar 34. The interspersed even pads are each independently connected to a corresponding signal pad 40.

The board has a lower major face 46 that is patterned the same as the upper face 32, so that all features and functions of the upper surface have a corresponding feature or function on the lower surface. The board includes multiple buried ground planes at different depths, as will be discussed below with respect to FIG. 2. In the preferred embodiment, the board is 1.395 inch wide by 0.935 inch long (from edge 26 to edge 30). It has a thickness of 0.053 inch, and is formed of GETEK laminates. The ground bar 34 is 0.10 inch wide and 0.71 inch long. There are 16 signal pads 40 on each face in the preferred embodiment, although this may be varied depending on the application. The signal pads are spaced apart at 0.066 inch center to center, and each pad is 0.035 inch wide and 0.090 inch long. In alternative embodiments, the PCB could also be a piece of metal shim stock. The pin pads 44 are spaced apart at 0.075 inch center to center, and each pad is 0.025 inch wide and 0.50 inch long.

The cables 14 and 16 are identical, each with 16 wires 50 (the number of which may vary as noted above with respect to the signal pads.) Each cable is formed as a ribbon with the wires connected to each other side-by-side, at least at the ends. The wires are coaxial, with a central signal-carrying conductor 52 surrounded by a dielectric 54, which is wrapped by a conductive shield 56. A jacket 60 surrounds the shield. In the preferred embodiment, the central conductor is 34 gauge, the dielectric has a diameter of 0.0245 inch, and the shield is a copper foil. The jacket is formed of PVC. The wires are arranged with a spacing of 0.066 inch, the same as that of the signal pads 40 on the board.

The spring pins 20 each include a metal sleeve 62 that receives a pin assembly 64 having an enlarged portion 65 containing electrical components as will be discussed below. An end portion of the pin protrudes from one end of the sleeve, and the pin slides axially within the sleeve. A spring in the sleeve at the other end biases the pin to an extended position (shown), and allows the pin to move into the sleeve under axial pressure, such as when the pin assembly is pressed toward a hard surface.

The housing elements 22, 24 are essentially identical. Each is a tray-shaped shell having a planar major wall 66, with peripheral side walls 70, 72, and a single end wall 74 extending perpendicularly from the major wall. The major wall 66 may incorporate features which vary in distance from the electrical elements of the board assembly 12. These features exist to maintain the consistency of the electrical ground return path (impedance). A front edge 76 of the major wall 66 has no wall attached. The end wall defines a cutout 80 that is a central section of the wall having a lower rim. The edges of the end wall at the cutout are semi-circularly radiused to receive a cable without sharp corners that may generate strain and impair cable performance. The inner surfaces of the housing elements are coated with a conductive material such as Chomerics CHO-Shield coatings to provide a shield against electrical and magnetic interference. The inner surfaces include all surfaces that face the printed circuit board 12. Thus, when assembled, there is a metallic enclosure that it open only at the slot to receive the cable, and at the side where the pins protrude. The housing is formed of plastic, and has a typical wall thickness of 0.040 inch. A pair of screw fasteners is used to secure the halves together, passing through bores 82 in the upper half 22, and engaging smaller bores 84 in the lower half.

Figure 2:
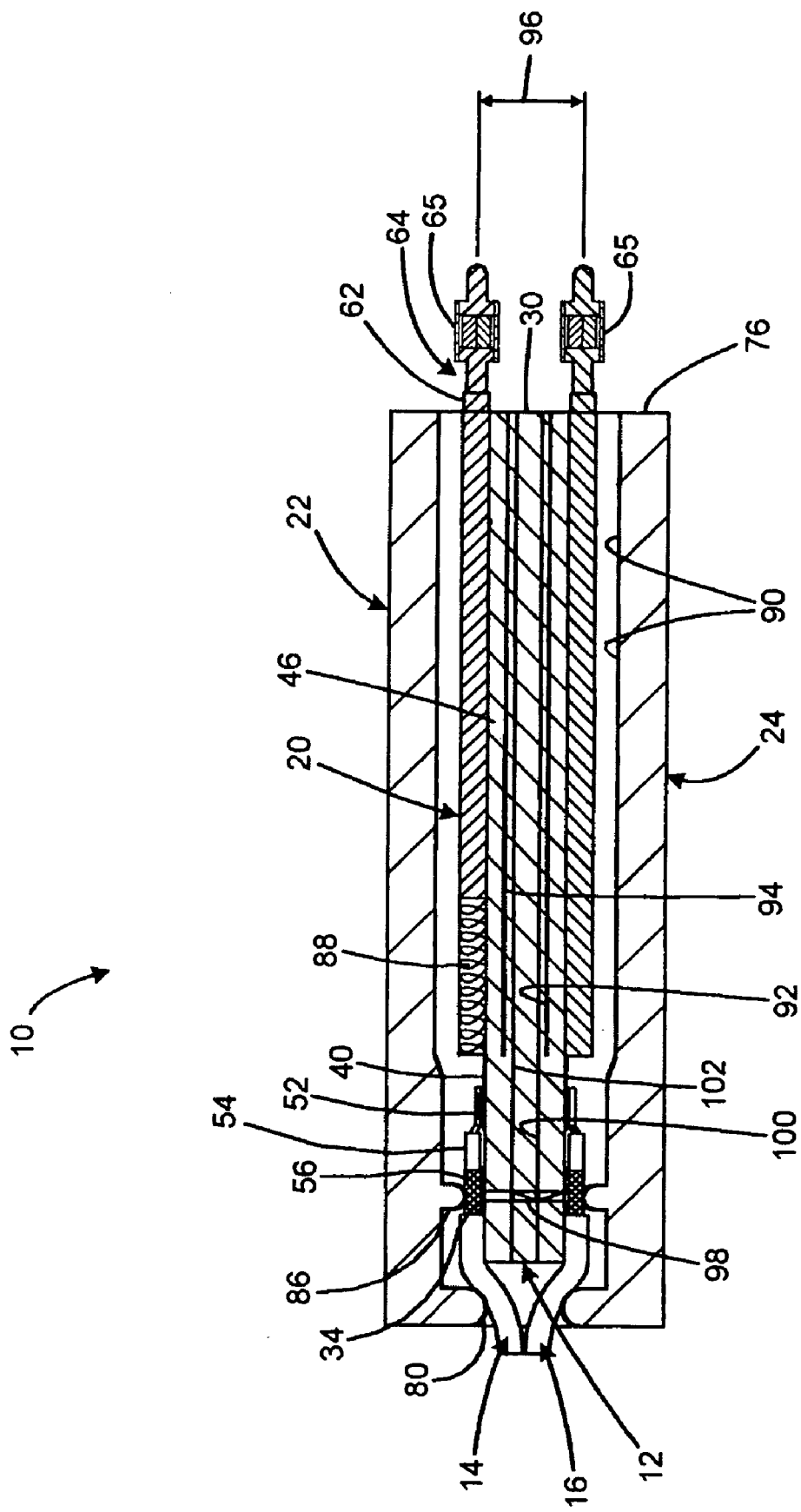
FIG. 2 is a sectional side view of the assembly of FIG. 1.

FIG. 2 shows the assembled terminal 10. The sleeves 62 of the spring pins 20 are soldered to the spring pin pads 46, so that the free ends of the pins protrude beyond the edge 30 of the board 12, and beyond the edge 76 of the housing elements 22, 24. Each spring pin element contains a compressed coil spring 88 as illustrated. The cables 14, 16 are connected to the board, with each exposed central conductor 52 soldered to a respective pad 40, and all the shields of each ribbon soldered to the ground bar 56. The ribs 86 press against the shields, so that the conductive layer 90 makes ohmic contact to ground the housing.

The board 12 has several interior buried ground planes. At a minimum, the board has two ground planes 92, 94, each equally spaced apart from the nearest major surface. The requirement for two ground planes exists because the spacing 96 between the rows of pins is pre-defined by design rules and the needs of the application. However, the spacing of the ground plane from the surface conductors is based on electrical design factors that are used to generate performance characteristics comparable to the coaxial wires. The housing conductive layer 90 and ground plane serve the same function as the shield of the coaxial wire; the alternating grounded pins provide lateral shielding with respect to adjacent pins. A ground via 98 connects to all of the ground planes, and to the ground bars 34. The number and placement of the ground vias will vary with different designs.

In addition, different portions of the board and circuit may have different impedance characteristics, and may require different ground plane spacings to achieve uniform impedance results. Ground planes may also reside on the outer surfaces of the board, to provide improved additional shielding and improve the ground return path of the signals. In the illustrated embodiment, ground planes 92 and 94 extend under the region of the pins. Deeper ground planes 100, 102 serve to provide shielding and impedance control away from the pins, where foil traces extend across the circuit board. Although not shown, there are connections between the ground planes 100, 102 and the via 98.

The spring pins and receptacles were chosen in concert with the locations of ground planes and the design of the housing to preserve the matched impedance characteristics of the electrical signal.

Figure 3:
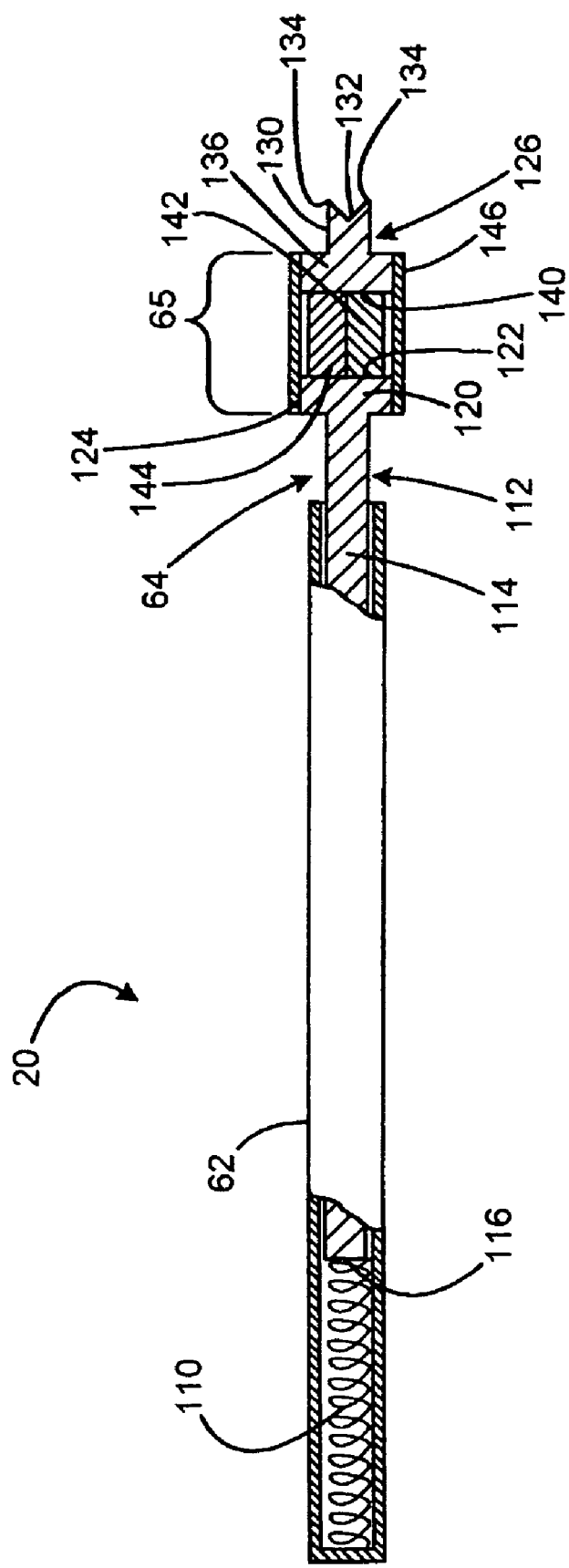
FIG. 3 is a sectional side view of a probe pin assembly according to the embodiment of FIG. 1.

FIG. 3 shows the spring pin 20 in which the pin assembly 64 is biased in the extended position by a spring 110 in the sleeve 62. The pin assembly includes two conductive metal portions. A first pin portion 112 has an elongated shaft 114, the majority of which is closely received in the sleeve. The shaft has a rear end 116 against which the spring presses. The first portion 112 terminates at the free end with an nail-head-like flange 120 having a flat circular surface 122 extending axially away from the pin, perpendicular to and centered on the pin axis. The flange has a cylindrical peripheral surface 124 having a diameter larger than the sleeve, although this may vary in alternative embodiments.

A second portion 126 of the pin is positioned forward of the first portion, and has a minimal length shaft 130 having a free end 132 having one or more sharp probe points 134. The shaft terminates at its rear end facing the first pin portion with a flange 136 shaped and sized the same as the first portion flange 120, with a rear surface 140 facing and parallel to the surface 122 of the first portion flange face. The pin portion shafts are aligned on a common axis.

The flange surfaces are mechanically and electrically connected to a resistor 142 and a capacitor 144 that are connected in parallel between the flanges. Each of these electronic components has a end pole face with metallization that facilitates soldering directly to the pin flange for a strong mechanical connection that provides structural support for the second pin portion. Sometimes the components are of unequal size and the mechanical shape of the flange must be shaped, (such as with a step) to accommodate the different dimensions. Also, the sleeve can provide mechanical strength to compensate when components are fragile, or too small or otherwise unsuited to provide substantial strength. To provide additional structural support, and to protect the components with a mechanical barrier and environmental seal, a plastic sleeve 146 encloses the flanges and components. The sleeve fits the flange peripheries closely, so that it can be sealed with a wicking adhesive such as cyanoacrylate. The sleeve has a length adequate to entirely cover the flanges without overhang.

In the preferred embodiment, the sleeve is formed of gold-plated nickel/silver, and has a length of 0.292 inch, a diameter of 0.025 inch, and an interior bore diameter of 0.020 inch. The pin's first portion 112 has a shaft length of 0.084 inch, a shaft diameter of 0.015 inch, a flange diameter of 0.020 inch, and a flange thickness or axial length of 0.010 inch. The pin's second portion 126 has a shaft length of 0.015 inch, and a shaft diameter of 0.020 inch. The pin portion shaft diameters is the same in the preferred embodiment, although this need not be the case for alternative embodiments where mechanical constraints of the probe tip and the sleeve bore may provide advantages to having different diameters. The second portion has a flange diameter of 0.020 inch, and a flange thickness or axial length of 0.010 inch.

The 0.025 inch overall length of the second pin portion 126 provides significant advantages in that this very limited length between the device being probed and the electrical components 142 and 144 yields an extremely high self resonance of 12 GHz, which allows useful operation up to this frequency limit. In alternative embodiments, the second portion length can be reduced to any practical limit, including using electrical components formed with end features. The second portion tip protrudes only sufficiently that angular misalignment or raised components on the device under test do not cause unwanted contact by the flange or sleeve.

It is believed that the second portion provides a beneficial combination of electrical performance and mechanical geometry when its length is less than double the flange diameter. Also, these benefits are achieved when the length is less than 0.050 inch, because this provides an adequately low loss tangent that absorbs transmitted energy. A typical loss tangent for a conventional trace on Kapton is 0.0030 while the preferred embodiment achieves a loss tangent of zero, because the conductive portion (metal tip) of the probe between the device under test and the RC components is surrounded by air, and not mounted on film or a PC Board. Comparative performance (0.027 inch diameter signal, 50 ohm) is described in the table below.

|  | Loss tangent | Dielectric constant | Loss per foot @ 10 GHz | −3 dB loss @ 1 foot |
|---|---|---|---|---|
| Kapton | 0.0030 | 3.40 | −3.72 dB | 5.60 GHz |
| Extruded FEP | 0.0007 | 2.03 | −3.12 dB | 8.90 GHz |
| Taped PTFE | 0.0007 | 1.35 | −2.85 dB | 13.0 GHz |
| Air | 0.0000 | 1.00 | −2.70 dB | 20.0 GHz |

Because the mass of the second pin portion is so much less than the entire pin plus sleeve of the prior art, it achieves reactive inductance significantly lower than the prior art, which must rely on passive RC components on the printed circuit board adjacent to the sleeve. The ratio of the lengths of second portion to the first portion (including sleeve) is less than 1 in 10, and the ratio of the mass of the second portion to that of the first portion and sleeve is less than 1:3. These low ratios provide an indication of the relative advantage of the preferred embodiment over solid pins with RC components mounted on the circuit board.

Alternative Embodiment

Figure 4:
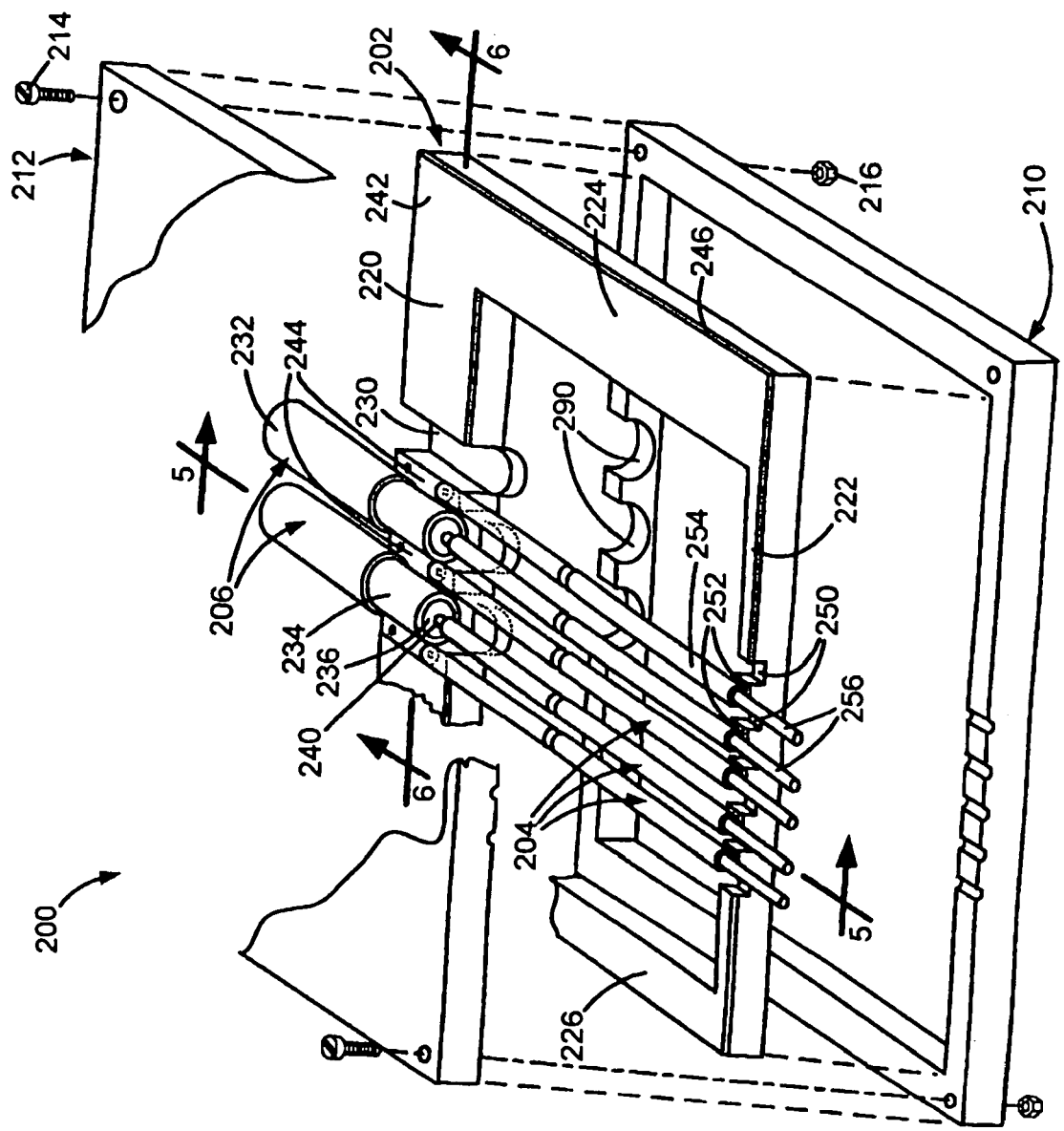
FIG. 4 is an exploded perspective view of a cable terminal assembly according to an alternative embodiment of the invention.

FIG. 4 shows an alternative embodiment probe assembly 200 for a cable terminal. The assembly includes a frame 202, an array of probes 204 connected to the frame, several coaxial cables 206 connected to the probes. A lower lid 210 and an upper lid 212 enclose the frame and probes, so that the pins protrude beyond the periphery of one side, and the cables extend from the other side. Threaded screws 214 and nuts 216 secure the lids together.

The frame 202 is a rectangular body with a large central opening. The frame has a first edge member 220 that supports the ends of the cables 206 and the rear ends of the probes 204. An opposed second edge member 222 supports the opposite ends of the probes, and side edge members 224 and 226 connect the first and second edge members. The first edge member defines a series of channels 230, each having a width to closely accommodate a cable end portion from which the outer sheath 233 has been stripped to expose a shield layer 234. The shield covers a dielectric layer 236 that surrounds a central signal conductor 240. The depth of each channel is less than half of the shield diameter, so that the entire central conductor remains above the upper surface 242 of the frame. The channels are spaced apart from each other to provide lands 244 between adjacent cable shields. The entire upper surface 242 of the frame is covered with a thin copper foil layer 246 in the manner of a printed circuit board, so that the lands 244 are conductive. This provides for soldering the shields and some of the probes to the first frame portion as will be discussed below.

The second edge member 222 of the frame also has an array of channels 250 that define an array of lands 252 between them. These lands are also covered with copper foil, so that the probes may be soldered. The channels 250 are arrayed at a pitch double that of the channels 230 of the first edge, with a minimal depth adequate to isolate the conductive land surfaces from each other. In the preferred embodiment, the coax cable is 34 AWG, the first channels have a center-to-center spacing of 0.033 inch (Signal to Ground), and the second channels have a spacing of 0.066 inch (Signal to Signal). The frame has a length of 1.250 inch, a thickness of 0.240 inch, a width (for an embodiment with 19 cables and 38 probes) of 1.000 inch. The frame's first edge has a width of 0.025 inch, and opposite edge a width of 0.250 inch, and sides edges a width of 0.175 inch.

Figure 5:
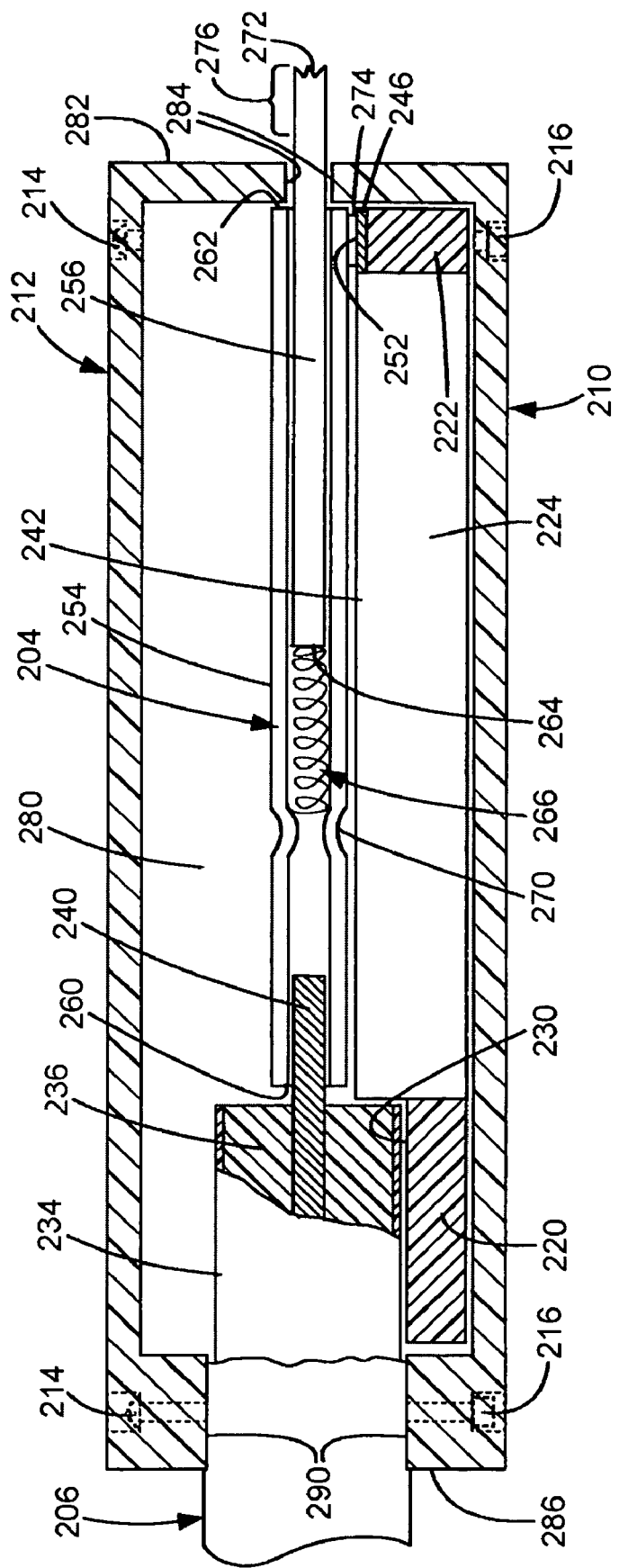
FIG. 5 is a sectional side view of the assembly of FIG. 4 taken along line 5-5.

Each probe 204 includes a tubular cylindrical sleeve 254 and a pin 256 partially received within the sleeve. As shown in FIG. 5, each sleeve has a rear end 260 adjacent to the cable 206, and a forward end 262 from which the pin 256 protrudes. The pin has a rear end 264 contacting a compression coil spring 266 received in the sleeve bore. A necked portion 270 of the sleeve provides rearward support for the spring at an intermediate portion of the sleeve. The pin has a sharp tip 272 that protrudes from the forward end 262 of the sleeve.

Referring back to FIG. 4, half of the probes are connected to the signal conductors of the cables, and half are connected to the shields to serve as ground conductors. These are arranged in alternating fashion in an evenly spaced array of parallel probes that has a ground probe at each end of the array. All of the probes are supported at the forward ends of their sleeves by the forward frame element 222. The forward ends of the sleeves are ohmically connected to the foil layer 246 with solder 274. The sleeve end does not extend beyond the frame edge, while an extending portion 276 protrudes well beyond the sleeve and frame.

Figure 6:
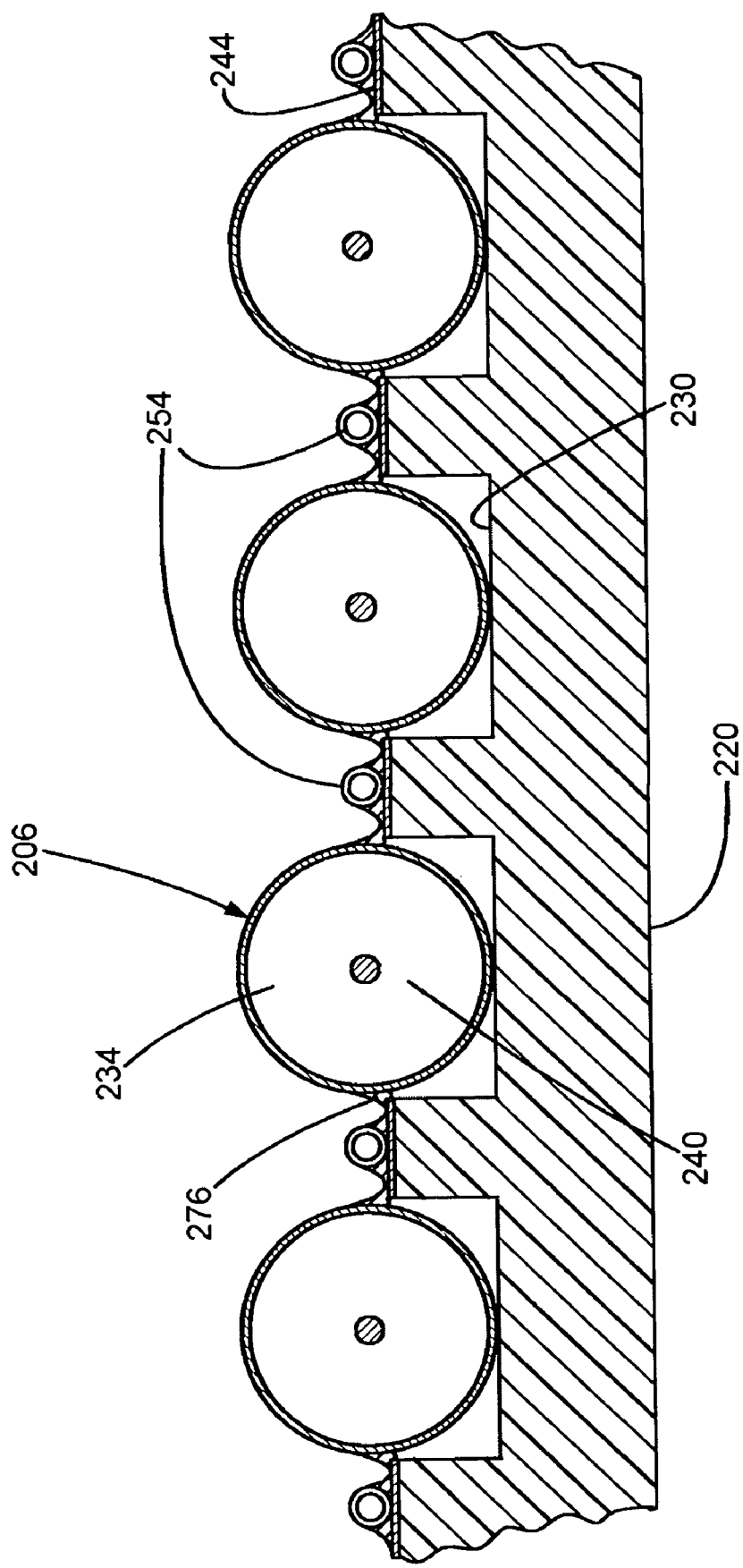
FIG. 6 is a sectional axial view of the assembly of FIG. 4 taken along line 6-6.

The rear ends of the sleeves are supported and connected differently depending on whether they are signal carriers, or the interdigitated ground carriers. As shown in FIG. 5 each signal-carrying probe is connected to the signal conductor 240 of a respective cable. The conductor is inserted into and is closely received by the bore at the rear end of the sleeve, and is soldered for an ohmic connection. The ground probes are connected as shown in FIG. 6. The rear ends of the sleeves 254 rest on the lands 244 between the cables at the exposed shield portions. A connection of solder 276 connects each shield 234 and sleeve to each adjacent land, so that all the shields are interconnected, as are the ends of the ground probe sleeves. The sleeves have a diameter of 0.027 inch, so that with the preferred spacing, there is a space of 0.006 inch between adjacent sleeves.

The ground probe sleeves are longer than the signal probe sleeves, because the ground sleeves must overlap the first frame edge to overlay the lands, while the signal probe sleeves need not overlap the lands, since the cable shield and dielectric portions extend to the edge of the frame portion, and the signal sleeves need not even fully reach the end of the dielectric. In an alternative embodiment, the cables may be positioned that the ends of the dielectric and shields do not reach the edge of the frame portion, but stop at an intermediate position. With this, a common sleeve size may be used, so that the ground sleeves overlap the frame portion while the signal sleeves also overlap the frame portion without interfering with the dielectric.

The illustrated embodiment provides a consistent signal and ground path length because contact or lack of contact between the pin shank and the forward aperture of a sleeve does not affect the path length. A signal passing through the pin or the sleeve, or both, follows the same length path without the disadvantages of the prior art described above.

Referring back to FIG. 5, the frame and sleeves are contained within a plastic box formed by the upper lid 212 and lower lid 210. The lids define a chamber 280 that provides an air space between the probes, and between the sleeves and each surface. A forward wall 282 of the box is positioned just forward of the forward ends of the sleeves, and has a minimal thickness of 0.025 inch to avoid excessive free pin length. The forward wall defines an array of apertures formed by semicircular cutouts 284 at the rims of the upper and lower lids. These apertures are sized to closely accommodate the pins without contact or friction. The box has a rear wall 286 that defines larger apertures also formed by semicircular cutouts 290 of the lid rims. These are sized slightly smaller than the overall diameter of the sheathed cable, so that the cable sheathing is slightly compressed when the lids are secured to each other, in the manner of a strain relief, to protect the solder joints from strain. In the preferred embodiment the chamber has a depth of 0.080 inch between the major surface of the lids, providing substantial clearance between the sleeves and the lid.

While the above is discussed in terms of preferred and alternative embodiments, the invention is not intended to be so limited.

The invention claimed is:

1. An electrical connector comprising:
a body;
a plurality of probes connected to the body;
each probe having a movable spring biased pin with a contact tip; and
each probe including a sleeve receiving the pin; and
each sleeve having a first end connected to an incoming conductor that is connected to a first portion of the body, a second end connected to a second portion of the body and from which the pin protrudes, and an intermediate portion suspended out of contact with the body between the first and second portions of the body.

2. The connector of claim 1 wherein each sleeve is spaced apart from adjacent sleeves without intervening material.

3. The connector of claim 1 wherein the sleeves are suspended in air except at their ends and are each spaced apart from adjacent sleeves.

4. The connector of claim 1 including a plurality of coaxial cables connected to the body, each cable having a signal conductor surrounded by a conductive shield, the probes being arranged in an array with every other probe connected to a respective signal conductor, and the remaining probes connected to the shields.

5. The connector of claim 4 wherein the second ends of the sleeves that are connected to the shields are interdigitated with the shields in an alternating pattern.

6. The connector of claim 4 wherein the first ends of the sleeves are each connected to respective metallized pads of a first array of pads.

7. The connector of claim 1 wherein the body has a peripheral edge and wherein the pins extend beyond the body.

8. The connector of claim 1 wherein each probe provides a generally linear conductive path from a tip of the probe, through a length of the probe to an opposite end of the probe in contact with a spring, through the spring to a contacting portion of the sleeve, and through a remaining sleeve portion to the incoming conductor, such that the conductive path does not rely on possible lateral contact between an intermediate portion of the pin and the first portion of the sleeve.

9. The connector of claim 1 wherein the body is a circuit element having a first linear portion supporting the sleeves at their first ends, and a second linear portion spaced apart from the first portion supporting at least some of the sleeves at their second ends.

10. The connector of claim 1 wherein the body is frame supporting the ends of the sleeves, and having an opening registered with the intermediate portion of the sleeves.

11. The connector of claim 1 wherein the body includes metallized surface portions to which the ends of the sleeves are soldered.

12. The connector of claim 11 wherein the metallized surface portions include a first array of pads, each positioned between adjacent incoming conductors.

13. The connector of claim 12 wherein the incoming conductors include surrounding shields, and wherein the shields are connected to the adjacent pads of the first array.

14. The connector of claim 13 wherein the shields are connected to each other at the first array.

15. The connector of claim 1 wherein the sleeves comprise two subsets each having a plurality of members, the members of each subset alternating with each other, and wherein the first ends of the sleeves of the members of one of the subsets extend beyond the first ends of the members of the other subset.

16. A connector assembly comprising:
a circuit element having a pattern of conductive surface portions;
a plurality of sleeves connected to the circuit element;
each sleeve containing a spring pin extending beyond a first peripheral edge portion of the circuit element;
a cable having a plurality of conductors electrically connected to the sleeves; and wherein the cable includes a plurality of coaxial wires each having a signal conductor and an outer shield, and a first subset of sleeves including every other sleeve are each connected to a respective signal conductor, and the others of the sleeves are connected to the shields.

17. The connector assembly of claim 16 wherein end portions of the sleeves of the first subset are interspersed in alternative arrangement with end portions of the shields.

18. The connector assembly of claim 16 wherein each sleeve has opposed ends and an intermediate portion, and wherein the sleeve is essentially parallel to the circuit element, and wherein the circuit element has an open portion underlying the intermediate portions.

19. The connector assembly of claim 16 wherein the intermediate portions of the sleeves are spaced apart from each other.

\* \* \* \* \*